United States Patent
Liu et al.

(10) Patent No.: US 10,361,272 B2
(45) Date of Patent: Jul. 23, 2019

(54) INGAALP SCHOTTKY FIELD EFFECT TRANSISTOR WITH ALGAAS CARRIER SUPPLY LAYER

(71) Applicant: WIN Semiconductors Corp., Tao Yuan (TW)

(72) Inventors: Shih-Ming Joseph Liu, Tao Yuan (TW); Yu-Chi Wang, Tao Yuan (TW); Cheng-Guan Yuan, Tao Yuan (TW); Hsi-Tsung Lin, Tao Yuan (TW); Chia Hsiung Lee, Tao Yuan (TW)

(73) Assignee: Win Semiconductors Corp., Tao Yuan (TW)

( * ) Notice: Subject to any disclaimer, the term of this patent is extended or adjusted under 35 U.S.C. 154(b) by 0 days.

(21) Appl. No.: 15/797,660

(22) Filed: Oct. 30, 2017

(65) Prior Publication Data
US 2019/0074356 A1 Mar. 7, 2019

(30) Foreign Application Priority Data
Sep. 6, 2017 (TW) .............................. 106130508 A

(51) Int. Cl.
*H01L 29/08* (2006.01)
*H01L 29/10* (2006.01)
*H01L 29/205* (2006.01)
*H01L 29/812* (2006.01)

(52) U.S. Cl.
CPC ........ *H01L 29/1029* (2013.01); *H01L 29/205* (2013.01); *H01L 29/8128* (2013.01)

(58) Field of Classification Search
CPC ........... H01L 29/0891; H01L 29/66257; H01L 29/66848; H01L 29/66962; H01L 29/7308; H01L 29/812
See application file for complete search history.

(56) References Cited

U.S. PATENT DOCUMENTS

2018/0012986 A1* 1/2018 Nevers ................ H01L 29/7786

* cited by examiner

*Primary Examiner* — Hoai V Pham
(74) *Attorney, Agent, or Firm* — Muncy, Geissler, Olds & Lowe, P.C.

(57) ABSTRACT

An InGaAlP Schottky field effect transistor with AlGaAs carrier supply layer comprises a buffer layer, a channel layer, a carrier supply layer, a Schottky barrier layer and a cap layer sequentially formed on a compound semiconductor substrate; the cap layer has a gate recess, a bottom of the gate recess is defined by the Schottky barrier layer; a source electrode and a drain electrode are formed respectively on the cap layer at two sides with respect to the gate recess, the source electrode and the drain electrode form respectively an ohmic contact with the cap layer; a gate electrode is formed on the Schottky barrier layer within the gate recess, the gate electrode and the Schottky barrier layer form a Schottky contact; wherein the carrier supply layer is made of AlGaAs; the Schottky barrier layer is made of InGaAlP.

23 Claims, 7 Drawing Sheets

INGAALP SCHOTTKY FIELD EFFECT TRANSISTOR WITH ALGAAS CARRIER SUPPLY LAYER

FIELD OF THE INVENTION

The present invention relates to an InGaAlP Schottky field effect transistor, especially related to an InGaAlP Schottky field effect transistor with AlGaAs carrier supply layer.

BACKGROUND OF THE INVENTION

Please refer to FIG. 10, which is a sectional schematic view of an embodiment of an InGaAlP Schottky field effect transistor of conventional technology. The main structure of the InGaAlP Schottky field effect transistor 9 of conventional technology comprises: a compound semiconductor substrate 901, a buffer layer 902, a lower barrier layer 920, a first spacer layer 906, a channel layer 907, a second spacer layer 908, an upper barrier layer 930, a cap layer 912, a source electrode 916, a drain electrode 917, a gate recess 915 and a gate electrode 914. The compound semiconductor substrate 901 is made of GaAs. The buffer layer 902 is formed on the compound semiconductor substrate 901, wherein the buffer layer 902 is made of GaAs. The lower barrier layer 920 is formed on the buffer layer 902, wherein the lower barrier layer 920 is made of AlGaAs. The lower barrier layer 920 comprises a lower-barrier sub-layer 903, a lower carrier supply layer 904 and a lower-barrier spacer layer 905, wherein the lower-barrier sub-layer 903 is formed on the buffer layer 902; the lower carrier supply layer 904 is formed on the lower-barrier sub-layer 903; the lower-barrier spacer layer 905 is formed on the lower carrier supply layer 904. The first spacer layer 906 is formed on the lower-barrier spacer layer 905 of the lower barrier layer 920, wherein the first spacer layer 906 is made of GaAs. The channel layer 907 is formed on the first spacer layer 906, wherein the channel layer 907 is made of InGaAs. The second spacer layer 908 is formed on the channel layer 907, wherein the second spacer layer 908 is made of GaAs. The upper barrier layer 930 is formed on the second spacer layer 908, wherein the upper barrier layer 930 is made of InGaAlP. The upper barrier layer 930 comprises an upper-barrier spacer layer 909, an upper carrier supply layer 910 and a Schottky barrier layer 911, wherein the upper-barrier spacer layer 909 is formed on the second spacer layer 908; the upper carrier supply layer 910 is formed on the upper-barrier spacer layer 909; the Schottky barrier layer 911 is formed on the upper carrier supply layer 910. The cap layer 912 is formed on the Schottky barrier layer 911 of the upper barrier layer 930, wherein the cap layer 912 is made of GaAs. An ohmic electrode layer 913 is formed on the cap layer 912, wherein the ohmic electrode layer 913 and the cap layer 912 form an ohmic contact. Patterning the ohmic electrode layer 913 and then etching the cap layer 912 to form the gate recess 915, wherein the etching is stopped at the Schottky barrier layer 911 such that a bottom of the gate recess 915 is defined by the Schottky barrier layer 911. In the left side of FIG. 10, the ohmic electrode layer 913 and the cap layer 912 form the ohmic contact to form the source electrode 916; while, in the right side of FIG. 10, the ohmic electrode layer 913 and the cap layer 912 form the ohmic contact to form the drain electrode 917. The gate electrode 914 is formed on the Schottky barrier layer 911 within the gate recess 915. And the gate electrode 914 and the Schottky barrier layer 911 form a Schottky contact.

The material of the Schottky barrier layer 911 is based on InGaAlP instead of the more commonly used AlGaAs in conventional technology. The bandgap of InGaAlP is higher than the bandgap of AlGaAs, when comparing the field effect transistor 9 having the InGaAlP (higher bandgap) Schottky barrier layer 911 and the field effect transistor having the AlGaAs (lower bandgap) Schottky barrier layer, the field effect transistor 9 having the InGaAlP (higher bandgap) Schottky barrier layer 911 has a lower leakage current and a higher breakdown voltage. Please refer to FIG. 11, which is a diagram showing the characteristics of gate-source voltage (Vgs) to transconductance (GM) and the characteristics of gate-source voltage (Vgs) to drain-source current (Ids) of an embodiment of an InGaAlP Schottky field effect transistor of conventional technology. It is obvious in the diagram of the characteristics of gate-source voltage (Vgs) to drain-source current (Ids) of an embodiment of an InGaAlP Schottky field effect transistor of conventional technology in FIG. 11 that the InGaAlP Schottky field effect transistor of conventional technology has a low leakage current, however, the slope of the curve of gate-source voltage to drain-source current is too small such that the required gate-source voltage change to turn off the drain-source current of the InGaAlP Schottky field effect transistor of conventional technology is too high. That is that to turn on or to turn off the drain-source current of the InGaAlP Schottky field effect transistor of conventional technology requires longer response time. It affects the high speed switching ability of the InGaAlP Schottky field effect transistor of conventional technology, especially for the application of high frequency microwave communications application.

Accordingly, the present invention has developed a new design which may avoid the above mentioned drawbacks, may significantly enhance the performance of the devices and may take into account economic considerations. Therefore, the present invention then has been invented.

SUMMARY OF THE INVENTION

The main technical problem that the present invention is seeking to solve is: to increase the slope of the curve of gate-source voltage to drain-source current of the InGaAlP Schottky field effect transistor such that the InGaAlP Schottky field effect transistor can response quickly on turn on or turn off the drain-source current to enhance the high speed switching ability of the InGaAlP Schottky field effect transistor for beneficial to high frequency microwave communications application.

In order to solve the problems mentioned the above and to achieve the expected effect, the present invention provides an InGaAlP Schottky field effect transistor with AlGaAs carrier supply layer, comprising: a compound semiconductor substrate, a buffer layer, a channel layer, a carrier supply layer, a Schottky barrier layer, a cap layer, a source electrode, a drain electrode and a gate electrode, wherein the buffer layer is formed on the compound semiconductor substrate; the channel layer is formed on the buffer layer; the carrier supply layer is formed on the channel layer, wherein the carrier supply layer is made of AlGaAs; the Schottky barrier layer is formed on the carrier supply layer, wherein the Schottky barrier layer is made of InGaAlP; the cap layer is formed on the Schottky barrier layer, wherein the cap layer has a gate recess, a bottom of the gate recess is defined by the Schottky barrier layer; the source electrode and the drain electrode are formed respectively on the cap layer at two sides with respect to the gate recess, wherein the source electrode and the drain electrode form respectively an ohmic contact with the cap layer; the gate electrode is formed on the Schottky barrier layer within the gate recess, the gate electrode and the Schottky barrier layer form a Schottky contact.

In an embodiment of the InGaAlP Schottky field effect transistor with AlGaAs carrier supply layer, wherein the Schottky barrier layer and the carrier supply layer have a Schottky-barrier-layer bandgap and a carrier-supply-layer bandgap respectively, wherein the Schottky-barrier-layer bandgap is greater than the carrier-supply-layer bandgap.

In an embodiment of the InGaAlP Schottky field effect transistor with AlGaAs carrier supply layer, it further comprising a first spacer layer and a second spacer layer, wherein the first spacer layer is formed on the buffer layer, the channel layer is formed on the first spacer layer, the second spacer layer is formed on the channel layer, the carrier supply layer is formed on the second spacer layer.

In an embodiment of the InGaAlP Schottky field effect transistor with AlGaAs carrier supply layer, wherein the first spacer layer is made of GaAs.

In an embodiment of the InGaAlP Schottky field effect transistor with AlGaAs carrier supply layer, wherein the second spacer layer is made of GaAs.

In an embodiment of the InGaAlP Schottky field effect transistor with AlGaAs carrier supply layer, it further comprising an upper-barrier spacer layer, wherein the upper-barrier spacer layer is formed on the second spacer layer, the carrier supply layer is formed on the upper-barrier spacer layer.

In an embodiment of the InGaAlP Schottky field effect transistor with AlGaAs carrier supply layer, wherein the upper-barrier spacer layer is made of AlGaAs.

In an embodiment of the InGaAlP Schottky field effect transistor with AlGaAs carrier supply layer, it further comprising a lower barrier layer, wherein the lower barrier layer is form on the buffer layer, the first spacer layer is formed on the lower barrier layer.

In an embodiment of the InGaAlP Schottky field effect transistor with AlGaAs carrier supply layer, wherein the lower barrier layer comprises a lower-barrier sub-layer, a lower carrier supply layer and a lower-barrier spacer layer, wherein the lower-barrier sub-layer is formed on the buffer layer, the lower carrier supply layer is formed on the lower-barrier sub-layer, the lower-barrier spacer layer is formed on the lower carrier supply layer, the first spacer layer is formed on the lower-barrier spacer layer.

In an embodiment of the InGaAlP Schottky field effect transistor with AlGaAs carrier supply layer, wherein the lower barrier layer is made of at least one material selected from the group consisting of: GaAs and AlGaAs.

In an embodiment of the InGaAlP Schottky field effect transistor with AlGaAs carrier supply layer, wherein the channel layer is made of $In_xGa_{1-x}As$, wherein the ratio of the composition of indium to gallium is x:1−x.

In an embodiment of the InGaAlP Schottky field effect transistor with AlGaAs carrier supply layer, wherein x is greater than or equal to 0.2 and less than or equal to 0.5.

In an embodiment of the InGaAlP Schottky field effect transistor with AlGaAs carrier supply layer, wherein the compound semiconductor substrate is made of GaAs.

In an embodiment of the InGaAlP Schottky field effect transistor with AlGaAs carrier supply layer, wherein the buffer layer is made of at least one material selected from the group consisting of: GaAs and AlGaAs.

In an embodiment of the InGaAlP Schottky field effect transistor with AlGaAs carrier supply layer, wherein the cap layer is made of GaAs.

For further understanding the characteristics and effects of the present invention, some preferred embodiments referred to drawings are in detail described as follows.

DETAILED DESCRIPTIONS OF PREFERRED EMBODIMENTS

Figure 1:
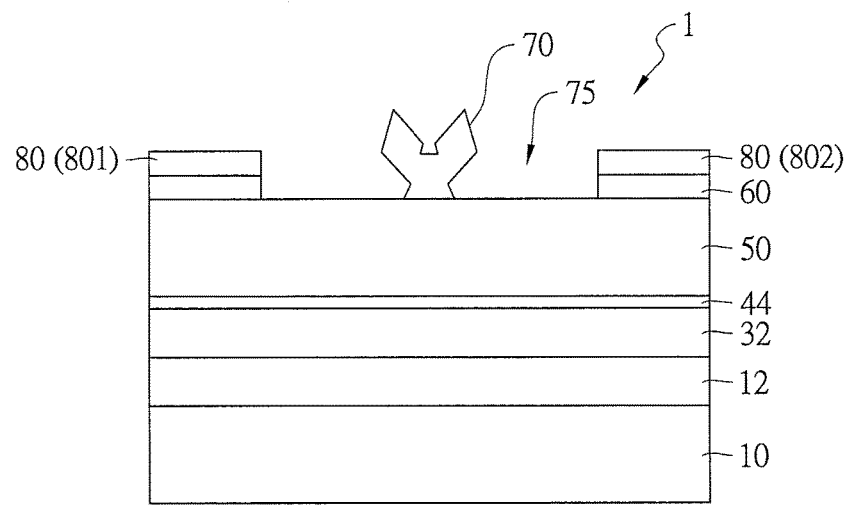
FIG. 1 is a sectional schematic view of an embodiment of an InGaAlP Schottky field effect transistor with AlGaAs carrier supply layer of the present invention.
Figure 9:
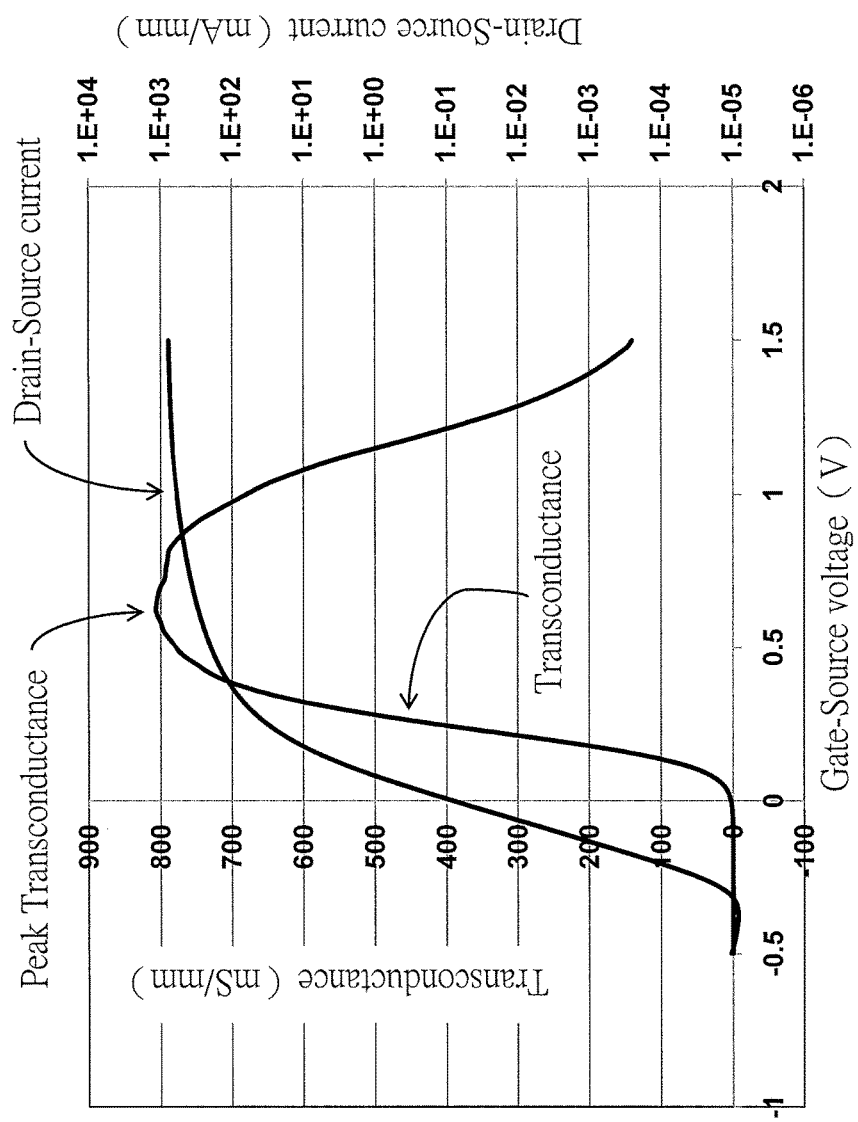
FIG. 9 is a diagram showing the characteristics of gate-source voltage to transconductance and the characteristics of gate-source voltage to drain-source current of an embodiment of an InGaAlP Schottky field effect transistor with AlGaAs carrier supply layer of the present invention.
Figure 10:
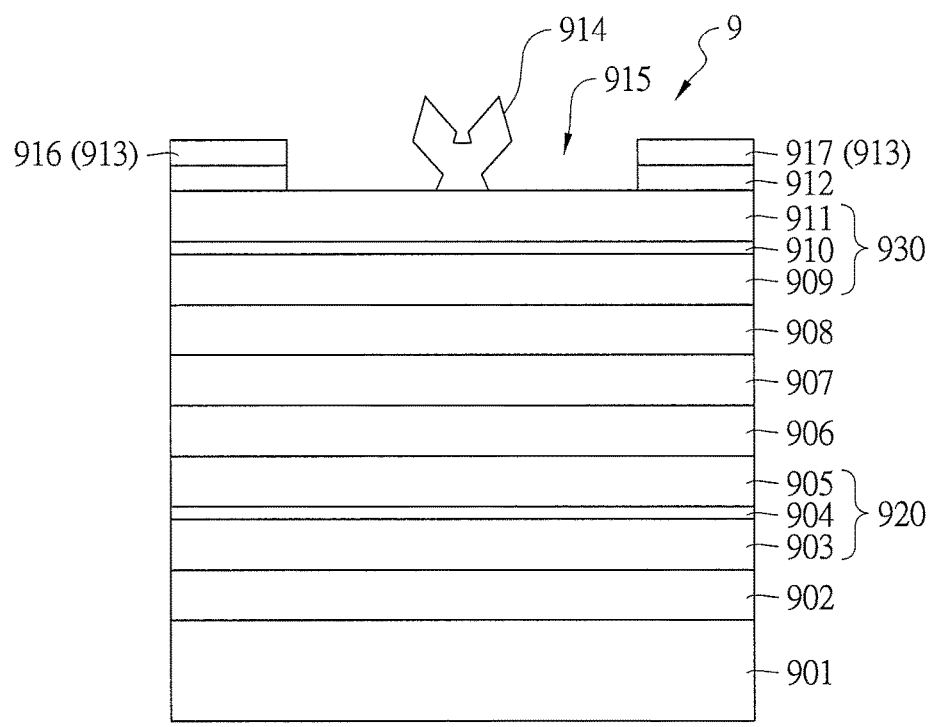
FIG. 10 is a sectional schematic view of an embodiment of an InGaAlP Schottky field effect transistor of conventional technology.
Figure 11:
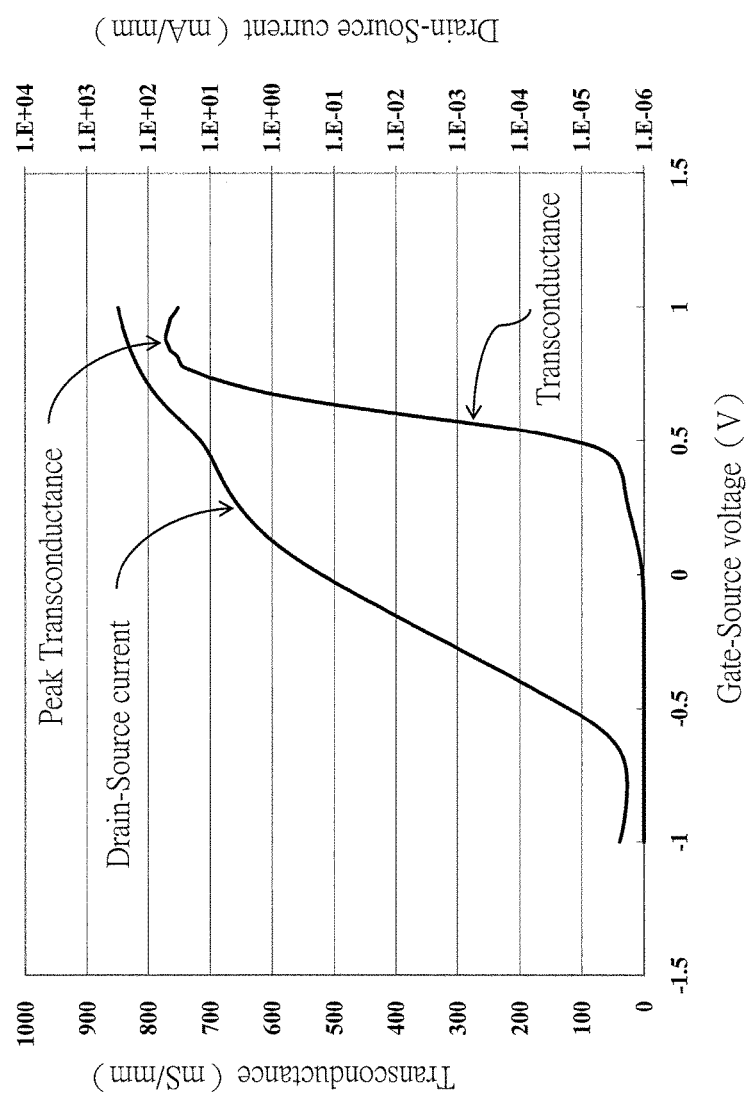
FIG. 11 is a diagram showing the characteristics of gate-source voltage to transconductance and the characteristics of gate-source voltage to drain-source current of an embodiment of an InGaAlP Schottky field effect transistor of conventional technology.

Please refer to FIG. 1, which shows a sectional schematic view of an embodiment of an InGaAlP Schottky field effect transistor with AlGaAs carrier supply layer of the present invention. An InGaAlP Schottky field effect transistor 1 with AlGaAs carrier supply layer of the present invention comprises: a compound semiconductor substrate 10, a buffer layer 12, a channel layer 32, a carrier supply layer 44, a Schottky barrier layer 50, a cap layer 60, a source electrode 801, a drain electrode 802 and a gate electrode 70. The compound semiconductor substrate 10 is made of GaAs. The buffer layer 12 is formed on the compound semiconductor substrate 10, wherein the buffer layer 12 is made of GaAs or AlGaAs. The channel layer 32 is formed on the buffer layer 12, wherein the channel layer 32 is made of $In_xGa_{1-x}As$, wherein the ratio of the composition of indium to gallium is x:1−x, wherein x is greater than or equal to 0.2 and less than or equal to 0.5. In a preferable embodiment, x is greater than or equal to 0.3 and less than or equal to 0.4. The carrier supply layer 44 is formed on the channel layer 32, wherein the carrier supply layer 44 is made of AlGaAs. The Schottky barrier layer 50 is formed on the carrier supply layer 44, wherein the Schottky barrier layer 50 is made of InGaAlP. The cap layer 60 is formed on the Schottky barrier layer 50, wherein the cap layer 60 is made of GaAs. An ohmic metal layer 80 is formed on the cap layer 60, wherein the ohmic metal layer 80 and the cap layer 60 form an ohmic contact. In some embodiments, the cap layer 60 is formed of the material of GaAs doped with Si with a high concentration. Patterning the ohmic metal layer 80 and then etching the cap layer 60 to form a gate recess 75, wherein the etching is stopped at the Schottky barrier layer 50 such that a bottom of the gate recess 75 is defined by the Schottky barrier layer 50. The gate electrode 70 is formed on the Schottky barrier layer 50 within the gate recess 75. And the gate electrode 70 and the Schottky barrier layer 50 form a Schottky contact. In the left side of FIG. 1, the ohmic metal layer 80 and the cap layer 60 form the ohmic contact to form the source electrode 801; while, in the right side of FIG. 1, the ohmic metal layer 80 and the cap layer 60 form the ohmic contact to form the drain electrode 802. The Schottky barrier layer 50 and the carrier supply layer 44 have a Schottky-barrier-layer bandgap and a carrier-supply-layer bandgap respectively, wherein the Schottky-barrier-layer bandgap is greater than the carrier-supply-layer bandgap. In the present invention, the InGaAlP Schottky field effect transistor 1 with AlGaAs carrier supply layer provides the carrier supply layer 44 which is made of AlGaAs between the Schottky barrier layer 50 (InGaAlP) and the channel layer 32 (InxGa1−xAs). The carrier-supply-layer bandgap of the carrier supply layer 44 is less than the Schottky-barrier-layer bandgap of the Schottky barrier layer 50, therefore, comparing to the InGaAlP Schottky field effect transistor 9 of the conventional technology (please referring to FIG. 10, the upper carrier supply layer 910 is made of InGaAlP), the InGaAlP Schottky field effect transistor 1 with AlGaAs carrier supply layer of the present invention has higher electromigration. The electronics characteristics please refer to FIG. 9. FIG. 9 is a diagram showing the characteristics of gate-source voltage to transconductance and the characteristics of gate-source voltage to drain-source current of an embodiment of an InGaAlP Schottky field effect transistor with AlGaAs carrier supply layer of the present invention. It is obvious comparing FIG. 9 and FIG. 11 that the slop of the curve of gate-source voltage to drain-source current of the InGaAlP Schottky field effect transistor with AlGaAs carrier supply layer of the present invention is much more than the slope of the curve of gate-source voltage to drain-source current of the InGaAlP Schottky field effect transistor of conventional technology. Therefore, the response time of turn-on or turn-off the drain-source current of the InGaAlP Schottky field effect transistor with AlGaAs carrier supply layer of the present invention is much faster than that of the InGaAlP Schottky field effect transistor of conventional technology. Hence, the InGaAlP Schottky field effect transistor with AlGaAs carrier supply layer of the present invention has higher speed switching ability and is more suitable for high frequency microwave communications application. Furthermore, please compare the characteristics of gate-source voltage to transconductance in FIG. 9 and FIG. 11. The peak transconductance (GM Peak) of the InGaAlP Schottky field effect transistor with AlGaAs carrier supply layer of the present invention is greater than 800 mmS/mm, which is higher than the peak transconductance 770 mmS/mm of the InGaAlP Schottky field effect transistor of conventional technology. Hence, the InGaAlP Schottky field effect transistor with AlGaAs carrier supply layer of the present invention has better characteristics.

Figure 2:
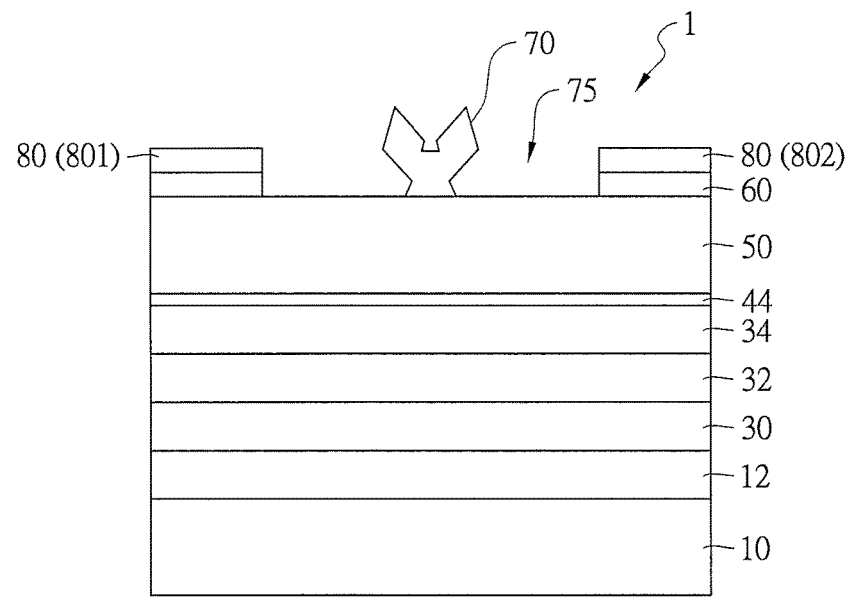
FIG. 2 is a sectional schematic view of another embodiment of an InGaAlP Schottky field effect transistor with AlGaAs carrier supply layer of the present invention.

Please refer to FIG. 2, which is a sectional schematic view of another embodiment of an InGaAlP Schottky field effect transistor with AlGaAs carrier supply layer of the present invention. The main structure of the embodiment of FIG. 2 is basically the same as the structure of the embodiment of FIG. 1, except that it further comprises a first spacer layer 30 and a second spacer layer 34, wherein the first spacer layer 30 is formed on the buffer layer 12; the channel layer 32 is formed on the first spacer layer 30; the second spacer layer 34 is formed on the channel layer 32; the carrier supply layer 44 is formed on the second spacer layer 34, wherein the first spacer layer 30 is made of GaAs; the second spacer layer 34 is made of GaAs.

Figure 3:
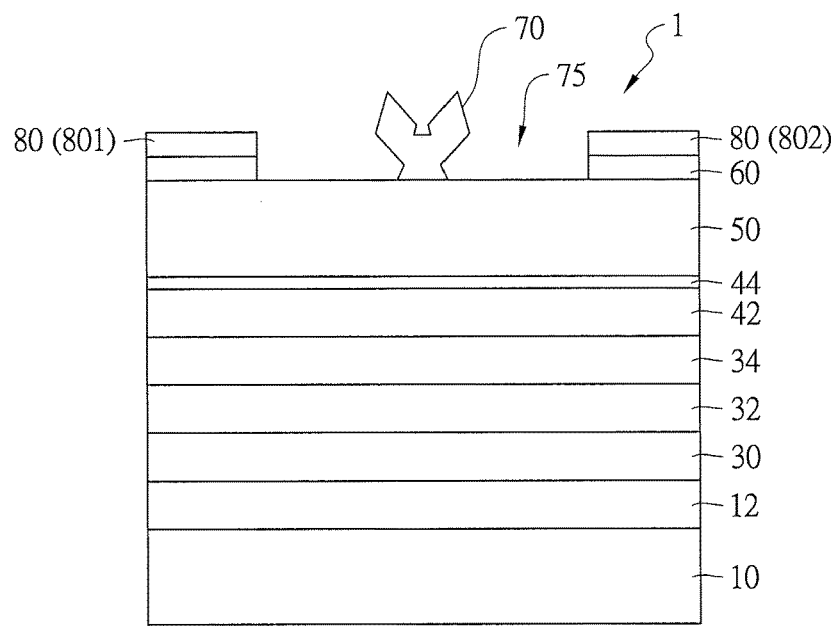
FIG. 3 is a sectional schematic view of another embodiment of an InGaAlP Schottky field effect transistor with AlGaAs carrier supply layer of the present invention.

Please refer to FIG. 3, which is a sectional schematic view of another embodiment of an InGaAlP Schottky field effect transistor with AlGaAs carrier supply layer of the present invention. The main structure of the embodiment of FIG. 3 is basically the same as the structure of the embodiment of FIG. 2, except that it further comprises an upper-barrier spacer layer 42, wherein the upper-barrier spacer layer 42 is formed on the second spacer layer 34; the carrier supply layer 44 is formed on the upper-barrier spacer layer 42, wherein the upper-barrier spacer layer 42 is made of AlGaAs.

Figure 4:
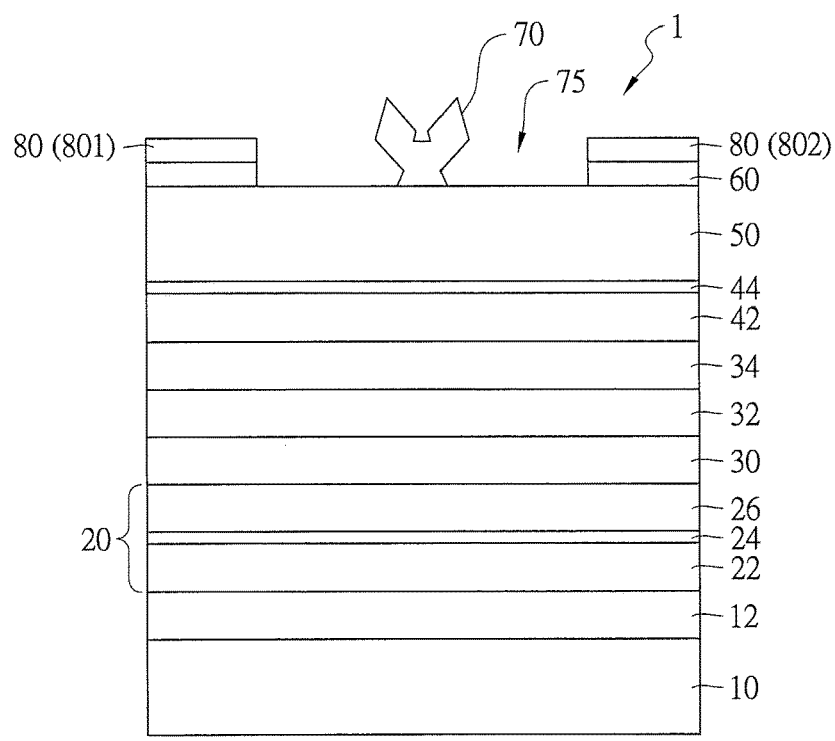
FIG. 4 is a sectional schematic view of another embodiment of an InGaAlP Schottky field effect transistor with AlGaAs carrier supply layer of the present invention.

Please refer to FIG. 4, which is a sectional schematic view of another embodiment of an InGaAlP Schottky field effect transistor with AlGaAs carrier supply layer of the present invention. The main structure of the embodiment of FIG. 4 is basically the same as the structure of the embodiment of FIG. 3, except that it further comprises a lower barrier layer 20, wherein the lower barrier layer 20 is formed on the buffer layer 12; the first spacer layer 30 is formed on the lower barrier layer 20, wherein the lower barrier layer 20 is made of at least one material selected from the group consisting of: GaAs and AlGaAs. In some embodiments, the lower barrier layer 20 comprises a lower-barrier sub-layer 22, a lower carrier supply layer 24 and a lower-barrier spacer layer 26, wherein the lower-barrier sub-layer 22 is formed on the buffer layer 12, the lower-barrier sub-layer 22 is made of at least one material selected from the group consisting of: GaAs and AlGaAs; wherein the lower carrier supply layer 24 is formed on the lower-barrier sub-layer 22, the lower carrier supply layer 24 is made of at least one material selected from the group consisting of: GaAs and AlGaAs; wherein the lower-barrier spacer layer 26 is formed on the lower carrier supply layer 24, the lower-barrier spacer layer 26 is made of at least one material selected from the group consisting of: GaAs and AlGaAs; wherein the first spacer layer 30 is formed on the lower-barrier spacer layer 26.

Figure 5:
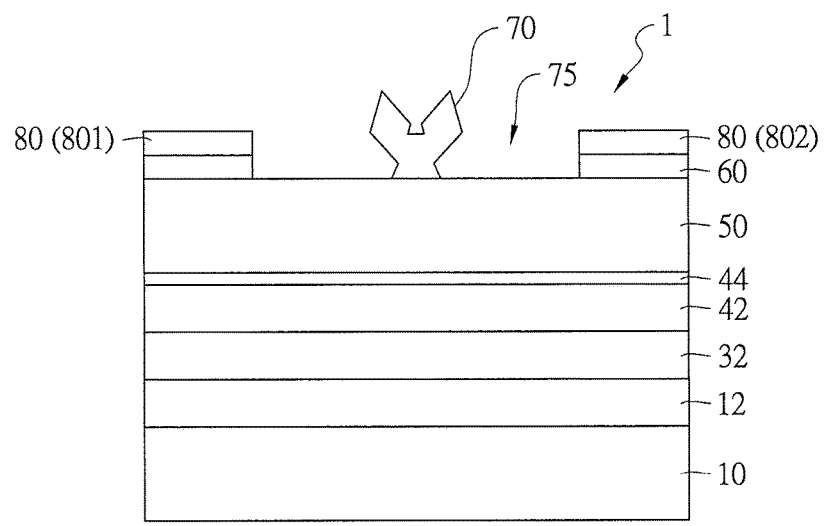
FIG. 5 is a sectional schematic view of an embodiment of an InGaAlP Schottky field effect transistor with AlGaAs carrier supply layer of the present invention.

Please refer to FIG. 5, which is a sectional schematic view of an embodiment of an InGaAlP Schottky field effect transistor with AlGaAs carrier supply layer of the present invention. The main structure of the embodiment of FIG. 5 is basically the same as the structure of the embodiment of FIG. 1, except that it further comprises an upper-barrier spacer layer 42, wherein the upper-barrier spacer layer 42 is formed on the channel layer 32; the carrier supply layer 44 is formed on the upper-barrier spacer layer 42; wherein the upper-barrier spacer layer 42 is made of AlGaAs.

Figure 6:
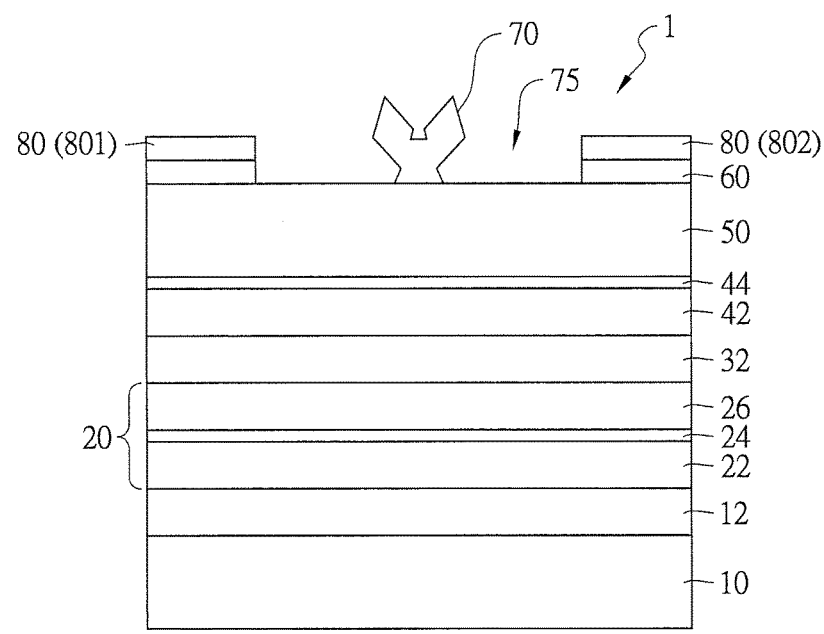
FIG. 6 is a sectional schematic view of another embodiment of an InGaAlP Schottky field effect transistor with AlGaAs carrier supply layer of the present invention.

Please refer to FIG. 6, which is a sectional schematic view of another embodiment of an InGaAlP Schottky field effect transistor with AlGaAs carrier supply layer of the present invention. The main structure of the embodiment of FIG. 6 is basically the same as the structure of the embodiment of FIG. 5, except that it further comprises a lower barrier layer 20, wherein the lower barrier layer 20 is formed on the buffer layer 12; the channel layer 32 is formed on the lower barrier layer 20, wherein the lower barrier layer 20 is made of at least one material selected from the group consisting of: GaAs and AlGaAs. In some embodiments, the lower barrier layer 20 comprises a lower-barrier sub-layer 22, a lower carrier supply layer 24 and a lower-barrier spacer layer 26, wherein the lower-barrier sub-layer 22 is formed on the buffer layer 12, the lower-barrier sub-layer 22 is made of at least one material selected from the group consisting of: GaAs and AlGaAs; wherein the lower carrier supply layer 24 is formed on the lower-barrier sub-layer 22, the lower carrier supply layer 24 is made of at least one material selected from the group consisting of: GaAs and AlGaAs; wherein the lower-barrier spacer layer 26 is formed on the lower carrier supply layer 24, the lower-barrier spacer layer 26 is made of at least one material selected from the group consisting of: GaAs and AlGaAs; wherein the channel layer 32 is formed on the lower-barrier spacer layer 26.

Figure 7:
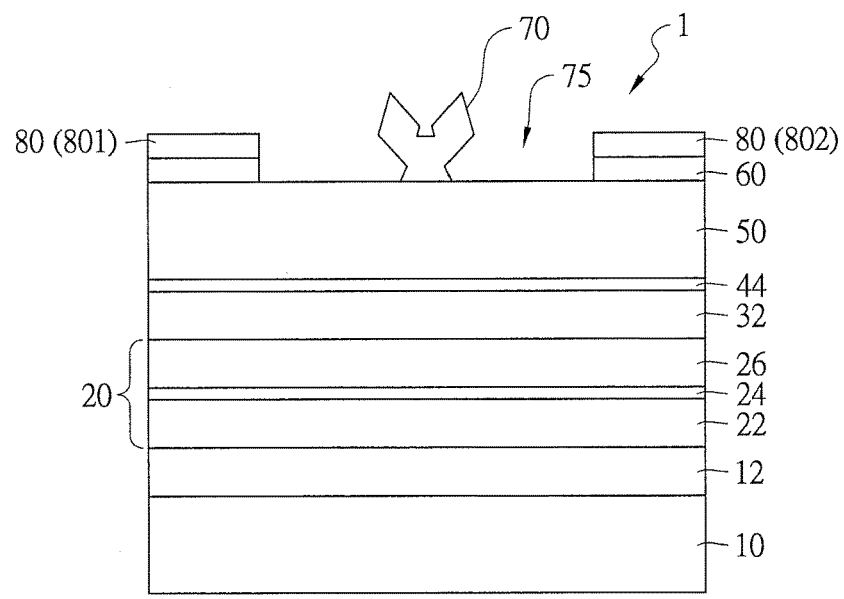
FIG. 7 is a sectional schematic view of another embodiment of an InGaAlP Schottky field effect transistor with AlGaAs carrier supply layer of the present invention.

Please refer to FIG. 7, which is a sectional schematic view of another embodiment of an InGaAlP Schottky field effect transistor with AlGaAs carrier supply layer of the present invention. The main structure of the embodiment of FIG. 7 is basically the same as the structure of the embodiment of FIG. 1, except that it further comprises a lower barrier layer 20, wherein the lower barrier layer 20 is formed on the buffer layer 12; the channel layer 32 is formed on the lower barrier layer 20, wherein the lower barrier layer 20 is made of at least one material selected from the group consisting of: GaAs and AlGaAs. In some embodiments, the lower barrier layer 20 comprises a lower-barrier sub-layer 22, a lower carrier supply layer 24 and a lower-barrier spacer layer 26, wherein the lower-barrier sub-layer 22 is formed on the buffer layer 12, the lower-barrier sub-layer 22 is made of at least one material selected from the group consisting of: GaAs and AlGaAs; wherein the lower carrier supply layer 24 is formed on the lower-barrier sub-layer 22, the lower carrier supply layer 24 is made of at least one material selected from the group consisting of: GaAs and AlGaAs; wherein the lower-barrier spacer layer 26 is formed on the lower carrier supply layer 24, the lower-barrier spacer layer 26 is made of at least one material selected from the group consisting of: GaAs and AlGaAs; wherein the channel layer 32 is formed on the lower-barrier spacer layer 26.

Figure 8:
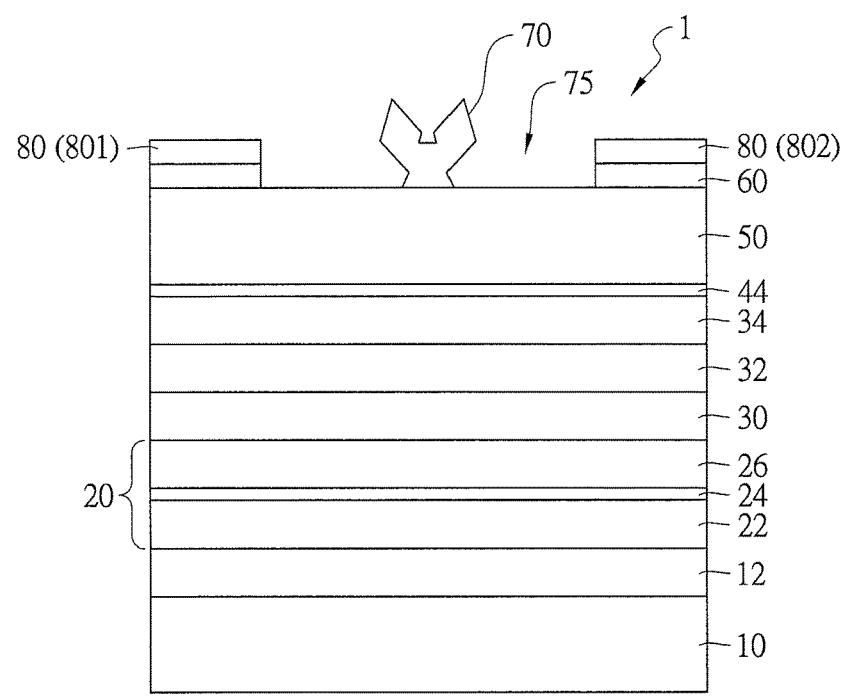
FIG. 8 is a sectional schematic view of another embodiment of an InGaAlP Schottky field effect transistor with AlGaAs carrier supply layer of the present invention.

Please refer to FIG. 8, which is a sectional schematic view of another embodiment of an InGaAlP Schottky field effect transistor with AlGaAs carrier supply layer of the present invention. The main structure of the embodiment of FIG. 8 is basically the same as the structure of the embodiment of FIG. 2, except that it further comprises a lower barrier layer 20, wherein the lower barrier layer 20 is formed on the buffer layer 12; the channel layer 32 is formed on the lower barrier layer 20, wherein the lower barrier layer 20 is made of at least one material selected from the group consisting of: GaAs and AlGaAs. In some embodiments, the lower barrier layer 20 comprises a lower-barrier sub-layer 22, a lower carrier supply layer 24 and a lower-barrier spacer layer 26, wherein the lower-barrier sub-layer 22 is formed on the buffer layer 12, the lower-barrier sub-layer 22 is made of at least one material selected from the group consisting of: GaAs and AlGaAs; wherein the lower carrier supply layer 24 is formed on the lower-barrier sub-layer 22, the lower carrier supply layer 24 is made of at least one material selected from the group consisting of: GaAs and AlGaAs; wherein the lower-barrier spacer layer 26 is formed on the lower carrier supply layer 24, the lower-barrier spacer layer 26 is made of at least one material selected from the group consisting of: GaAs and AlGaAs; wherein the channel layer 32 is formed on the lower-barrier spacer layer 26.

As disclosed in the above description and attached drawings, the present invention can provide an InGaAlP Schottky field effect transistor with AlGaAs carrier supply layer. It is new and can be put into industrial use.

Although the embodiments of the present invention have been described in detail, many modifications and variations may be made by those skilled in the art from the teachings disclosed hereinabove. Therefore, it should be understood that any modification and variation equivalent to the spirit of the present invention be regarded to fall into the scope defined by the appended claims.

What is claimed is:

1. An InGaAlP Schottky field effect transistor with AlGaAs carrier supply layer comprising:
    a compound semiconductor substrate;
    a buffer layer formed on said compound semiconductor substrate;
    a channel layer formed on said buffer layer;
    a carrier supply layer formed on said channel layer, wherein said carrier supply layer is made of AlGaAs;
    a Schottky barrier layer formed on said carrier supply layer, wherein said Schottky barrier layer is made of InGaAlP;
    a cap layer formed on said Schottky barrier layer, wherein said cap layer has a gate recess, a bottom of said gate recess is defined by said Schottky barrier layer;
    a source electrode and a drain electrode are formed respectively on said cap layer at two sides with respect to said gate recess, wherein said source electrode and said drain electrode form respectively an ohmic contact with said cap layer; and
    a gate electrode formed on said Schottky barrier layer within said gate recess, wherein said gate electrode and said Schottky barrier layer form a Schottky contact.

2. The InGaAlP Schottky field effect transistor with AlGaAs carrier supply layer according to claim 1, wherein said Schottky barrier layer and said carrier supply layer have a Schottky-barrier-layer bandgap and a carrier-supply-layer bandgap respectively, wherein said Schottky-barrier-layer bandgap is greater than said carrier-supply-layer bandgap.

3. The InGaAlP Schottky field effect transistor with AlGaAs carrier supply layer according to claim 1, further comprising a first spacer layer and a second spacer layer, wherein said first spacer layer is formed on said buffer layer, said channel layer is formed on said first spacer layer, said second spacer layer is formed on said channel layer, said carrier supply layer is formed on said second spacer layer.

4. The InGaAlP Schottky field effect transistor with AlGaAs carrier supply layer according to claim 3, wherein said first spacer layer is made of GaAs.

5. The InGaAlP Schottky field effect transistor with AlGaAs carrier supply layer according to claim 3, wherein said second spacer layer is made of GaAs.

6. The InGaAlP Schottky field effect transistor with AlGaAs carrier supply layer according to claim 3, further comprising an upper-barrier spacer layer, wherein said upper-barrier spacer layer is formed on said second spacer layer, said carrier supply layer is formed on said upper-barrier spacer layer.

7. The InGaAlP Schottky field effect transistor with AlGaAs carrier supply layer according to claim 6, wherein said upper-barrier spacer layer is made of AlGaAs.

8. The InGaAlP Schottky field effect transistor with AlGaAs carrier supply layer according to claim 3, further comprising a lower barrier layer, wherein said lower barrier layer is form on said buffer layer, said first spacer layer is formed on said lower barrier layer.

9. The InGaAlP Schottky field effect transistor with AlGaAs carrier supply layer according to claim 8, wherein said lower barrier layer comprises a lower-barrier sub-layer, a lower carrier supply layer and a lower-barrier spacer layer, wherein said lower-barrier sub-layer is formed on said buffer layer, said lower carrier supply layer is formed on said lower-barrier sub-layer, said lower-barrier spacer layer is formed on said lower carrier supply layer, said first spacer layer is formed on said lower-barrier spacer layer.

10. The InGaAlP Schottky field effect transistor with AlGaAs carrier supply layer according to claim 8, wherein said lower barrier layer is made of at least one material selected from the group consisting of: GaAs and AlGaAs.

11. The InGaAlP Schottky field effect transistor with AlGaAs carrier supply layer according to claim 1, further comprising a lower barrier layer, wherein said lower barrier layer is form on said buffer layer, said channel layer is formed on said lower barrier layer.

12. The InGaAlP Schottky field effect transistor with AlGaAs carrier supply layer according to claim 11, wherein said lower barrier layer comprises a lower-barrier sub-layer, a lower carrier supply layer and a lower-barrier spacer layer, wherein said lower-barrier sub-layer is formed on said buffer layer, said lower carrier supply layer is formed on said lower-barrier sub-layer, said lower-barrier spacer layer is formed on said lower carrier supply layer, said channel layer is formed on said lower-barrier spacer layer.

13. The InGaAlP Schottky field effect transistor with AlGaAs carrier supply layer according to claim 11, wherein said lower barrier layer is made of at least one material selected from the group consisting of: GaAs and AlGaAs.

14. The InGaAlP Schottky field effect transistor with AlGaAs carrier supply layer according to claim 1, further comprising an upper-barrier spacer layer, wherein said upper-barrier spacer layer is formed on said channel layer, said carrier supply layer is formed on said upper-barrier spacer layer.

15. The InGaAlP Schottky field effect transistor with AlGaAs carrier supply layer according to claim 14, wherein said upper-barrier spacer layer is made of AlGaAs.

16. The InGaAlP Schottky field effect transistor with AlGaAs carrier supply layer according to claim 14, further comprising a lower barrier layer, wherein said lower barrier layer is form on said buffer layer, said channel layer is formed on said lower barrier layer.

17. The InGaAlP Schottky field effect transistor with AlGaAs carrier supply layer according to claim 16, wherein said lower barrier layer comprises a lower-barrier sub-layer, a lower carrier supply layer and a lower-barrier spacer layer, wherein said lower-barrier sub-layer is formed on said buffer layer, said lower carrier supply layer is formed on said lower-barrier sub-layer, said lower-barrier spacer layer is formed on said lower carrier supply layer, said channel layer is formed on said lower-barrier spacer layer.

18. The InGaAlP Schottky field effect transistor with AlGaAs carrier supply layer according to claim 16, wherein said lower barrier layer is made of at least one material selected from the group consisting of: GaAs and AlGaAs.

19. The InGaAlP Schottky field effect transistor with AlGaAs carrier supply layer according to claim 1, wherein said channel layer is made of $In_xGa_{1-x}As$, wherein the ratio of the composition of indium to gallium is x:1−x.

20. The InGaAlP Schottky field effect transistor with AlGaAs carrier supply layer according to claim 19, wherein said x is greater than or equal to 0.2 and less than or equal to 0.5.

21. The InGaAlP Schottky field effect transistor with AlGaAs carrier supply layer according to claim 1, wherein said compound semiconductor substrate is made of GaAs.

22. The InGaAlP Schottky field effect transistor with AlGaAs carrier supply layer according to claim 1, wherein said buffer layer is made of at least one material selected from the group consisting of: GaAs and AlGaAs.

23. The InGaAlP Schottky field effect transistor with AlGaAs carrier supply layer according to claim 1, wherein said cap layer is made of GaAs.

\* \* \* \* \*